(12) United States Patent
Fan

(10) Patent No.: US 10,711,992 B2
(45) Date of Patent: Jul. 14, 2020

(54) ILLUMINATION FAN

(71) Applicant: Cooler Master Technology Inc., New Taipei (TW)

(72) Inventor: Shaodong Fan, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 59 days.

(21) Appl. No.: 16/133,982

(22) Filed: Sep. 18, 2018

(65) Prior Publication Data

US 2019/0316769 A1 Oct. 17, 2019

(30) Foreign Application Priority Data

Apr. 13, 2018 (CN) .......................... 2018 2 0525831

(51) Int. Cl.
| | | |
|---|---|---|
| F21V 33/00 | (2006.01) | |
| F21V 3/02 | (2006.01) | |
| H05K 7/20 | (2006.01) | |
| F04D 29/00 | (2006.01) | |
| F04D 19/00 | (2006.01) | |
| F21Y 105/18 | (2016.01) | |
| H05K 1/18 | (2006.01) | |
| F21Y 115/10 | (2016.01) | |

(52) U.S. Cl.
CPC ........ F21V 33/0096 (2013.01); F04D 29/005 (2013.01); F21V 3/02 (2013.01); F21V 33/0092 (2013.01); H05K 7/20172 (2013.01); F04D 19/002 (2013.01); F21Y 2105/18 (2016.08); F21Y 2115/10 (2016.08); H05K 1/189 (2013.01); H05K 2201/055 (2013.01); H05K 2201/10106 (2013.01); H05K 2201/10522 (2013.01)

(58) Field of Classification Search
CPC ............ H05K 7/20172; F04D 25/0613; F04D 29/005; F04D 29/526; F04D 29/00; F21V 33/0052; F21V 33/0096; F21V 23/005; G06F 1/20; F21Y 2103/33; F21Y 2107/10; F21Y 2115/10
See application file for complete search history.

(56) References Cited

U.S. PATENT DOCUMENTS

| 2006/0012973 | A1* | 1/2006 | Lin | .................... | H05K 7/20172 362/96 |
|---|---|---|---|---|---|
| 2016/0154164 | A1* | 6/2016 | Lin | ...................... | G02B 6/0095 362/96 |
| 2017/0225186 | A1* | 8/2017 | Ferguson | ................ | F03B 13/00 |

FOREIGN PATENT DOCUMENTS

| CN | 207049042 U | * | 2/2018 | ............. | F04D 25/08 |
|---|---|---|---|---|---|
| CN | 208010623 U | * | 10/2018 | ............. | F04D 25/08 |

* cited by examiner

Primary Examiner — Isiaka O Akanbi
Assistant Examiner — Fatima N Farokhrooz
(74) Attorney, Agent, or Firm — Locke Lord LLP; Tim Tingkang Xia, Esq.

(57) ABSTRACT

An illumination fan includes a housing, a fan blade, a light guiding component and a light source. The housing defines a fan space and an accommodation space. The fan blade is disposed in the fan space. The light guiding component surrounds the fan blade, and at least part of the light guiding component is disposed in the accommodation space. The light source is disposed in the accommodation space and located below the light guiding component.

21 Claims, 6 Drawing Sheets

ILLUMINATION FAN

CROSS-REFERENCE TO RELATED APPLICATIONS

This non-provisional application claims priority under 35 U.S.C. § 119(a) on Patent Application No(s). 201820525831.4 filed in China on Apr. 13, 2018, the entire contents of which are hereby incorporated by reference.

TECHNICAL FIELD

The disclosure relates to a fan in an electronic device, more particularly to an illumination fan.

BACKGROUND

An illumination fan is a heat dissipation device widely applied to electronic devices. The rotation of fan blades generates air flow to blow heat in an electronic device to the outside, thereby maintaining the temperature of the electronic device to prevent thermal damage.

In recent years, the demand for more functionalities of electronic devices has been increasing. In addition, there is an increasing demand for electronic devices featuring a beautiful appearance and charming visual effects. Therefore, the manufacturer usually installs a light source on the illumination fan to form a visual effect of a light ring as a decoration.

A conventional illumination fan is provided with one or more light-emitting diodes disposed on the fan frame. A light guiding component, such as an acrylic ring containing light diffusion powders, is disposed on the circumference of the fan frame to guide the light emitted by the light-emitting diodes, thereby achieving multi-directional illumination. However, the arrangement of the light-emitting diodes and the light guiding component in the conventional illumination fan increases the overall diameter of the conventional illumination fan. To meet the specification of a standard illumination fan, it is necessary to reduce the diameter of the conventional illumination fan by using a smaller fan blade, and thus a poor heat dissipation efficiency of the illumination fan may occur.

SUMMARY

The present disclosure provides an illumination fan to solve the problem of smaller fan blades caused by the light-emitting diodes and the light guiding component which overly occupy the space in the illumination fan.

According to one aspect of the disclosure, an illumination fan includes a housing, a fan blade, a light guiding component and a light source. The housing defines a fan space and an accommodation space. The fan blade is disposed in the fan space. The light guiding component surrounds the fan blade, and at least part of the light guiding component is disposed in the accommodation space. The light source is disposed in the accommodation space and located below the light guiding component.

According to another aspect of the disclosure, an illumination fan includes a housing, a fan blade, a light guiding component and a light source.

The housing defines a fan space and includes an inner sidewall and an outer sidewall. The inner sidewall includes a first protrusion, and the outer sidewall includes a second protrusion. The fan blade is disposed in the fan space. The light guiding component includes two recesses opposite to each other. The two recesses respectively correspond to the first protrusion and the second protrusion. The first protrusion and the second protrusion respectively extend into the two recesses to jointly hold the light guiding component. The light source is disposed below the light guiding component.

According to the disclosure, the light source is located below the light guiding component. The light guiding component is sandwiched by the sidewalls of the housing so as to be spaced apart from a bottom surface of the housing, and a space between the light guiding component and the bottom surface of the housing is configured to accommodate the light source. Compared with a conventional illumination fan in which a light source is disposed on a lateral side of the light guiding component or between the light guiding component and the sidewall of the frame, the light source and the light guiding component, disclosed in the present disclosure, are arranged at the same cross-section in a vertical direction, such that it is favorable for preventing an overly large radial size of the illumination fan since both the light source and the light guiding component are disposed in a relatively small accommodation space, thereby achieving compactness of the illumination fan. Due to a smaller accommodation space, the compact illumination fan provides sufficient fan space for accommodating larger fan blades, thereby enhancing heat dissipation efficiency.

BRIEF DESCRIPTION OF THE DRAWINGS

The present invention will become better understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
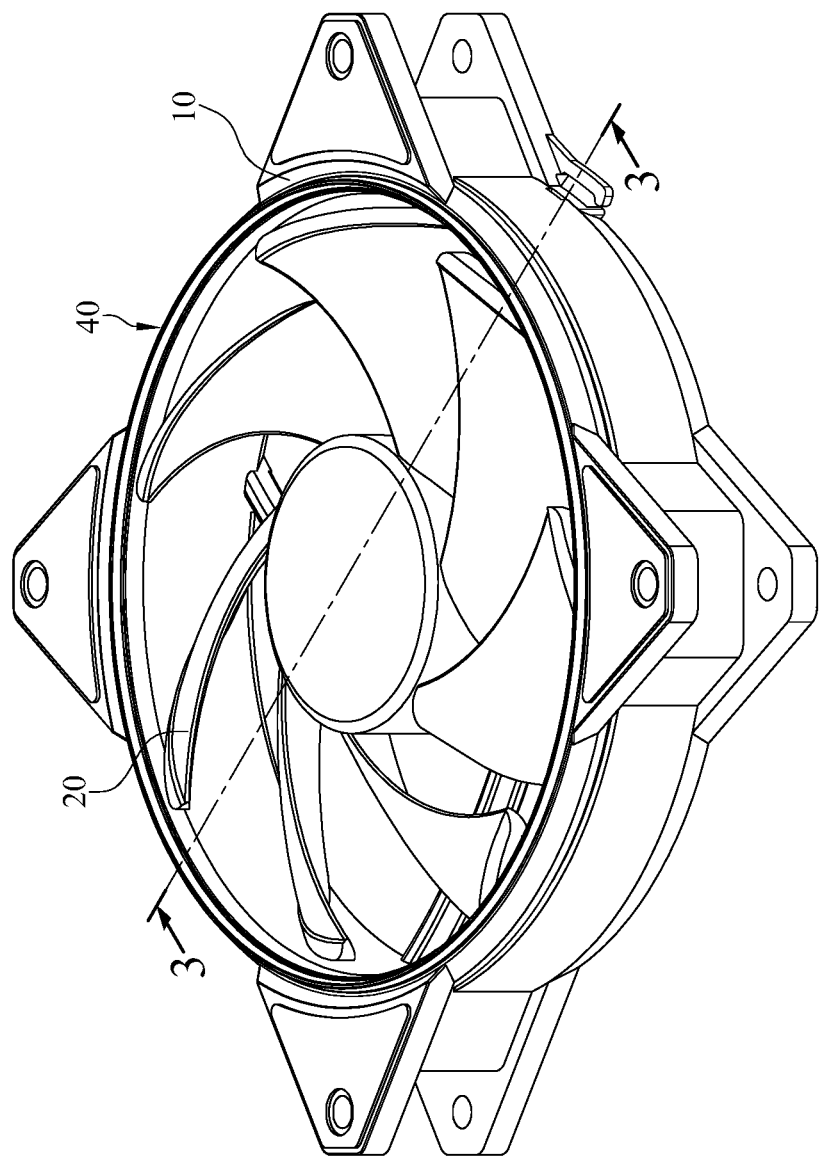
FIG. 1 is a perspective view of an illumination fan according to a first embodiment of the disclosure.
Figure 2:
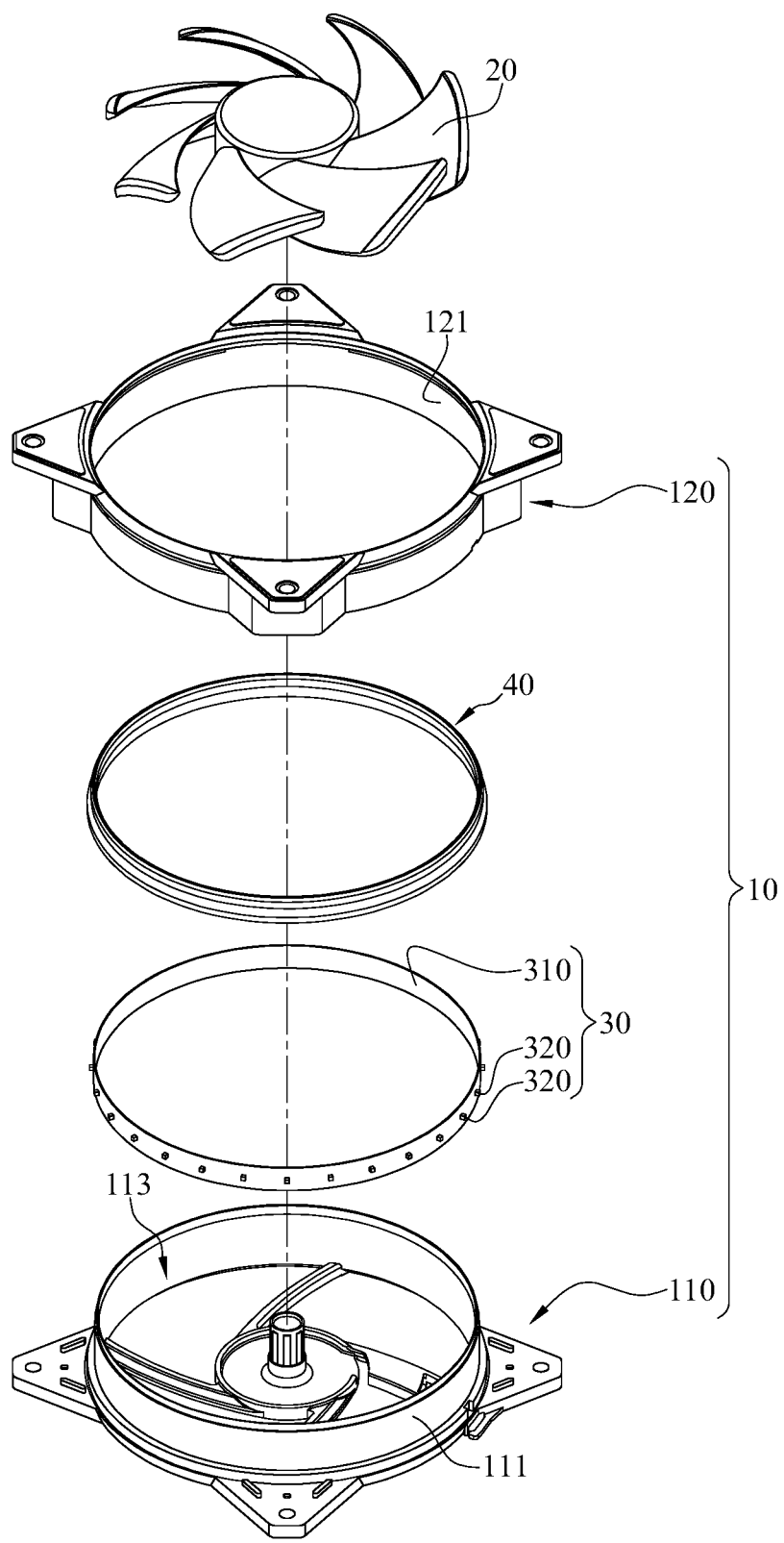
FIG. 2 is an exploded view of the illumination fan in FIG. 1.
Figure 3A:
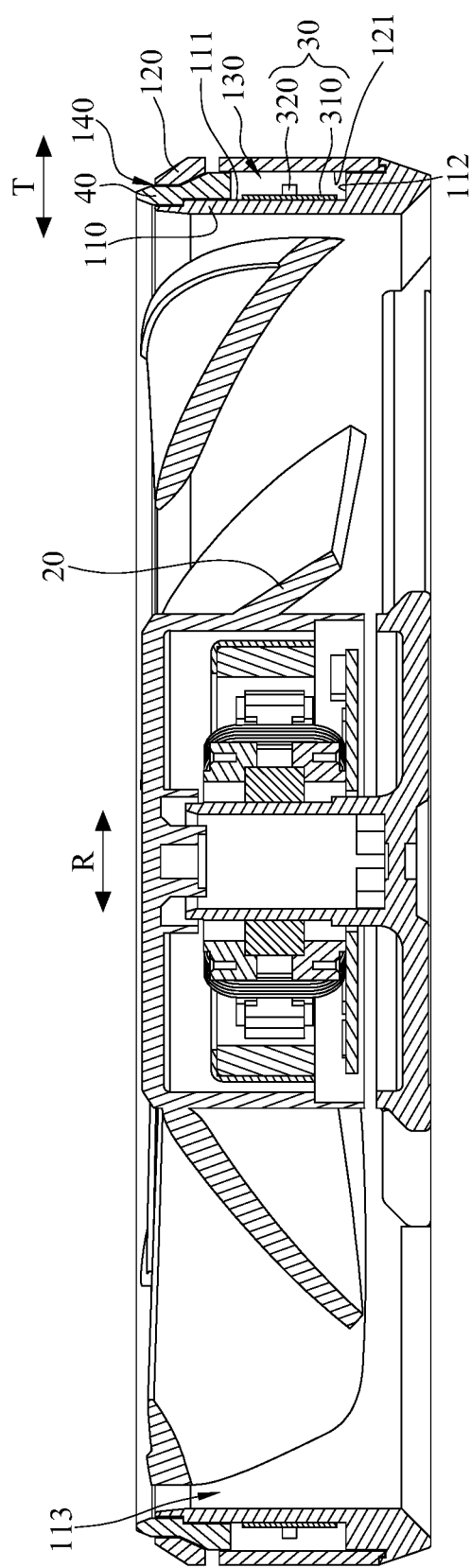
FIG. 3A is a cross-sectional view of the illumination fan in FIG. 1 along line 3-3.
Figure 3B:
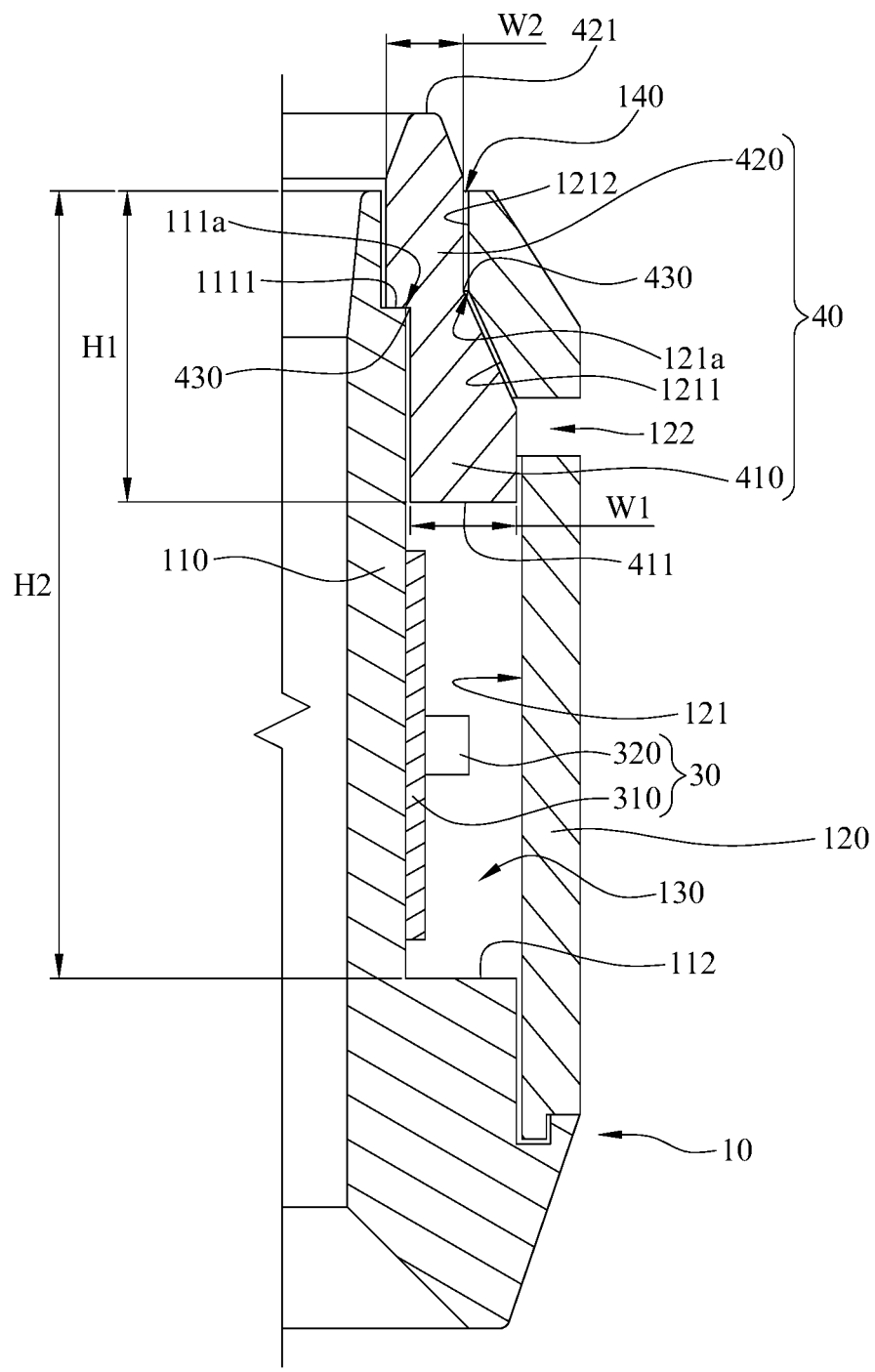
FIG. 3B is a partially enlarged view of the illumination fan in FIG. 3A.

Please refer to FIG. 1 through FIG. 3B. FIG. 1 is a perspective view of an illumination fan according to a first embodiment of the disclosure. FIG. 2 is an exploded view of the illumination fan in FIG. 1. FIG. 3A is a cross-sectional view of the illumination fan in FIG. 1 along line 3-3. FIG. 3B is a partially enlarged view of the illumination fan in FIG. 3A. In this embodiment, an illumination fan 1 includes a housing 10, a fan blade 20, a light source 30 and a light guiding component 40.

The housing 10 includes a lower frame 110 and an upper frame 120. The lower frame 110 includes an outer sidewall 111 and a side surface 112, and the upper frame 120 includes an inner sidewall 121 facing toward the outer sidewall 111. The outer sidewall 111, the side surface 112 and the inner sidewall 121 jointly define an accommodation space 130. The housing 10 further includes an annular opening 140 located between the top edge of the outer sidewall 111 and the top edge of the inner sidewall 121, and the annular opening 140 is communicated with the accommodation space 130. The lower frame 110 of the housing 10 defines a fan space 113 configured to accommodate a motor (not shown in the drawings). The fan blade 20 is disposed in the fan space 113 of the lower frame 110, and a shaft of the motor is inserted into a central hole of the fan blade 20.

The light source 30 includes a circuit board 310 and multiple light emitting units 320. The circuit board 310, for example, but not limited to, is a flexible printed circuit board (FPC) disposed in the accommodation space 130 of the housing 10. A thickness direction T of the circuit board 310 extends along a radial direction R of the fan blade 20; that is, the circuit board 310 is disposed in the accommodation space 130 and in an upright position. The light emitting units 320, for example, but not limited to, are light emitting diodes disposed on the circuit board 310. The light emitting units 320s are arranged around a central axis of the fan blade 20. It is worth noting that the scope of the present disclosure is not limited to the number of the light emitting unit 320. In this embodiment, the circuit board 310 is disposed on the outer sidewall 111 of the lower frame 110, but the present disclosure is not limited thereto. In some other embodiments, the circuit board 310 is disposed on the inner sidewall 121 of the upper frame 120.

The light guiding component 40, for example, but not limited to, is a plastic ring containing light diffusion powders, and the light guiding component 40 is disposed on the housing 10 and surrounds the fan blade 20. In detail, the light guiding component 40 includes a light receiving portion 410 located in the accommodation space 130 and a light emitting portion 420 protruding outward from the annular opening 140 of the housing 10. Light emitted by the light emitting unit 320 travels into the light guiding component 40 through a light receiving side 411 of the light receiving portion 410 and then travels out of the light guiding component 40 through a light emitting side 421 of the light emitting portion 420 or a slot 122 formed on the upper frame 120. The light guiding component 40 is sandwiched between the outer sidewall 111 of the lower frame 110 and the inner sidewall 121 of the upper frame 120, such that the light emitting portion 420 is spaced apart from the side surface 112 of the lower frame 110, and thus it is able to dispose the light source 30 below the light guiding component 40 to locate the light source 30 between the light emitting portion 420 and the side surface 112. In detail, the outer sidewall 111 of the housing 10 includes a first protrusion 111a, and the inner sidewall 121 of the housing 10 includes a second protrusion 121a.

The first protrusion 111a includes a blocking surface 1111, and a normal direction of the blocking surface 1111 is non-orthogonal to a normal direction of the side surface 112 of the lower frame 110. In detail, the blocking surface 1111 is a horizontal surface with its normal direction parallel to the normal direction of the side surface 112 in this embodiment, but the present disclosure is not limited thereto. The second protrusion 121a includes an inclined surface 1211 and a vertical surface 1212. The inclined surface 1211 is located between the vertical surface 1212 and the side surface 112, and the inclined surface 1211 extends from the vertical surface 1212 along a direction away from the outer sidewall 111 of the lower frame 110. The light guiding component 40 includes two recesses 430 opposite to each other, and the two recesses 430 respectively correspond to the first protrusion 111a and the second protrusion 121a.

As shown in FIG. 3A and FIG. 3B, the following is a description of the assembly of elements in the illumination fan 1. The fan blade 20 is disposed in the fan space 113 of the lower frame 110. Then, the light source 30 and the light guiding component 40 are disposed on the outer sidewall 111 of the lower frame 110. Specifically, the light guiding component 40 is positioned on the blocking surface 1111 of the first protrusion 111a so as to stay at a particular position by the support of the blocking surface 1111. Then, the upper frame 120 is assembled with the lower frame 110, such that the first protrusion 111a and the second protrusion 121a respectively extend into the two recesses 430 to jointly hold the light guiding component 40. The inclined surface 1211 of the second protrusion 121a contacts the light guiding component 40 so as to prevent an unpredictable movement of the light guiding component 40 in an upward direction. The blocking surface 1111 is favorable for preventing an unpredictable movement of the light guiding component 40 in a downward direction.

As shown in FIG. 3B, in this embodiment, the light emitting portion 420 of the light guiding component 40, protruding outward from the annular opening 140, is in a shape of a cone. Thus, it is favorable for enhancing an intensity of light emitted from the light emitting portion 420. It is worth noting that the present disclosure is not limited to the shape of the light emitting portion 420.

Furthermore, as shown in FIG. 3B, a thickness H1 of a part of the light guiding component 40 in the accommodation space 130 is smaller than a height H2 of the accommodation space 130. Thus, it is favorable for providing a sufficient amount of space in the housing 10 for accommodating the light source 30. In some embodiments, the thickness H1 of the part of the light guiding component 40 in the accommodation space 130 is smaller than half of the height H2 of the accommodation space 130, such that a light source with larger size is able to be accommodated in the housing 10. It is worth noting that the present disclosure is not limited to the ratio of thickness H1 to height H2.

Moreover, as shown in FIG. 3B, a horizontal width W1 of the light receiving side 411 of the light receiving portion 410 of the light guiding component 40 is larger than a horizontal width W2 of the light emitting side 421 of the light emitting portion 420. Thus, it is favorable for receiving a larger amount of light emitted by the light source 30 so as to enhance the illuminance. It is worth noting that the present disclosure is not limited to the relationships among the light receiving side 411, the light emitting side 421 and the horizontal width.

Figure 4:
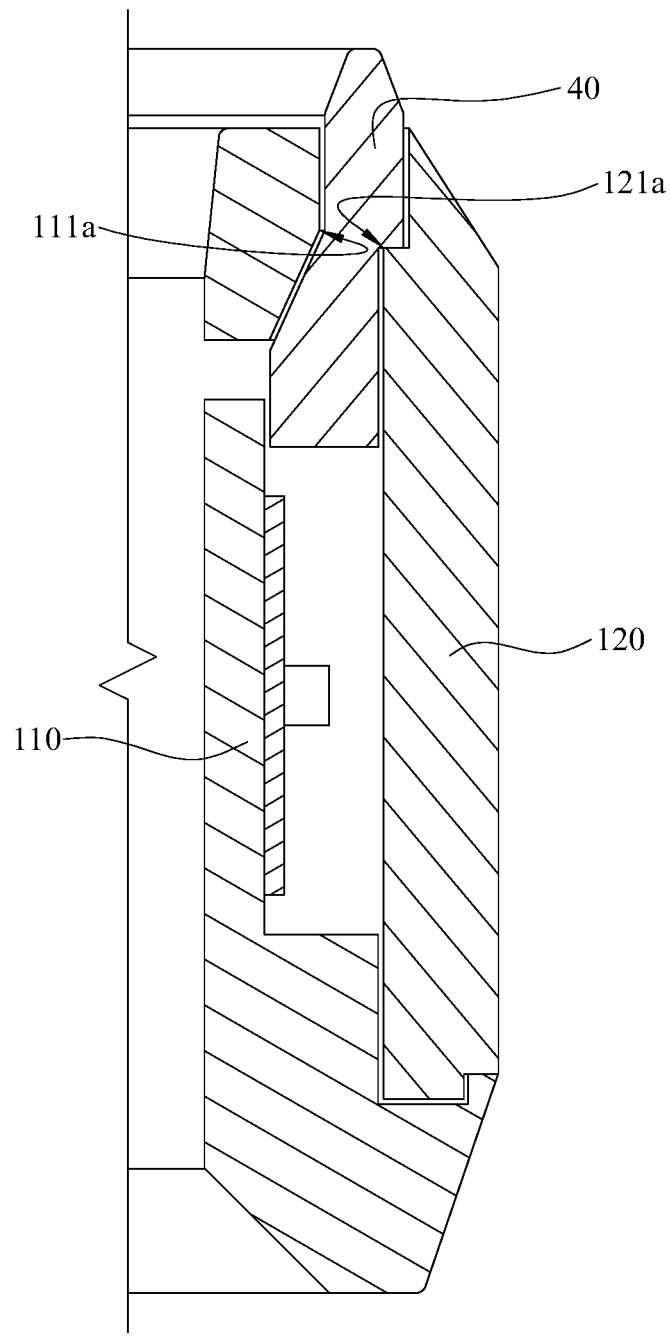
FIG. 4 is a cross-sectional view of an illumination fan according to a second embodiment of the disclosure.

FIG. 4 is a cross-sectional view of an illumination fan according to a second embodiment of the disclosure. Since the second embodiment is similar to the first embodiment, only the differences will be illustrated hereafter.

In this embodiment, a lower frame 110 of the illumination fan includes a first protrusion 111a, and the first protrusion 111a includes an inclined surface and a vertical surface. An upper frame 120 of the illumination fan includes a second protrusion 121a, and the second protrusion 121a includes a blocking surface. A light guiding component 40 is disposed on the blocking surface of the second protrusion 121a, and then the upper frame 120 is assembled with the lower frame 110 such that the light guiding component 40 is held by the first protrusion 111a and the second protrusion 121a. Detailed descriptions of the inclined surface, the vertical surface, and the blocking surface can refer to the descriptions of the inclined surface 1211, the vertical surface 1212 and the blocking surface 1111 in the first embodiment, thus are not repeated hereafter.

Figure 5:
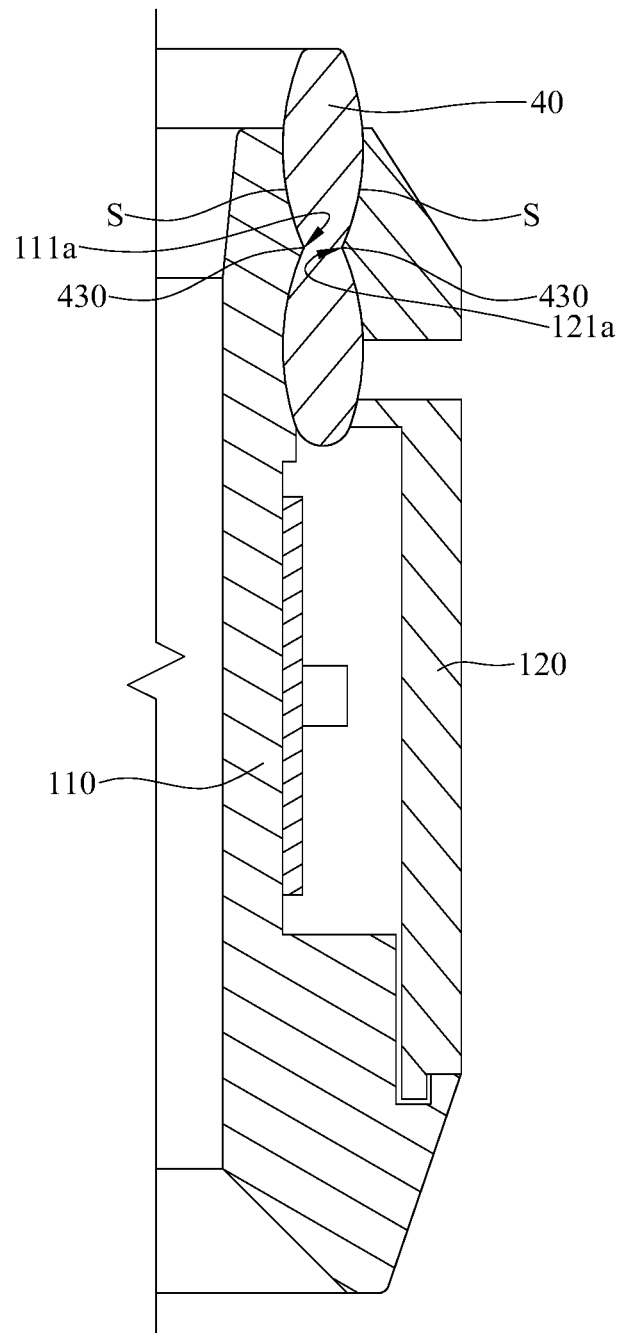
FIG. 5 is a cross-sectional view of an illumination fan according to a third embodiment of the disclosure.

FIG. 5 is a cross-sectional view of an illumination fan according to a third embodiment of the disclosure. Since the third embodiment is similar to the first embodiment, only the differences will be illustrated hereafter.

In this embodiment, both a first protrusion 111a of a lower frame 110 and a second protrusion 121a of an upper frame 120 have an arcuate profile S. The first protrusion 111a and the second protrusion 121a respectively extend into two recesses 430 of a light guiding component 40 so as to jointly hold the light guiding component 40. The unpredictable movement of the light guiding component 40 is prevented by the arcuate profiles S.

According to the disclosure, the circuit board of the light source is disposed in the housing and is in an upright position, and the light source is located below the light guiding component. The light guiding component is sandwiched by the sidewalls of the housing so as to be spaced apart from the bottom surface of the housing, and a space between the light guiding component and the bottom surface of the housing is configured to accommodate the light source. Accordingly, compared with a conventional illumination fan in which a light source is disposed on a lateral side of the light guiding component or between the light guiding component and the sidewall of the frame, the light source and the light guiding component, disclosed in the present disclosure, are arranged at the same cross-section in a vertical direction, such that it is favorable for preventing an overly large radial size of the illumination fan since both the light source and the light guiding component are disposed in a relatively small accommodation space, thereby achieving compactness of the illumination fan. Due to a smaller accommodation space, the compact illumination fan provides sufficient fan space for accommodating larger fan blade, thereby enhancing heat dissipation efficiency.

The foregoing description, for the purpose of explanation, has been described with reference to specific embodiments; however, the embodiments were chosen and described in order to explain the principles of the disclosure and its practical applications, to thereby enable others skilled in the art to utilize the disclosure and various embodiments with various modifications which are suited to the particular use being contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. An illumination fan, comprising:
    a housing defining a fan space and an accommodation space; and
    a fan blade disposed in the fan space;
    a light guiding component surrounding the fan blade, and at least part of the light guiding component being disposed in the accommodation space; and
    a light source disposed in the accommodation space and located below the light guiding component;
    wherein the housing comprises an upper frame and a lower frame, the lower frame comprises an outer sidewall and a side surface, the upper frame comprises an inner sidewall facing toward the outer sidewall, the outer sidewall, the side surface and the inner sidewall jointly define the accommodation space, and the light guiding component is sandwiched between the inner sidewall and the outer sidewall.

2. The illumination fan according to claim 1, wherein the light source comprises a circuit board and a light emitting unit, the light emitting unit is disposed on the circuit board, the circuit board is disposed in the accommodation space and is in an upright position, and a thickness direction of the circuit board is along a radial direction of the fan blade.

3. The illumination fan according to claim 1, wherein the light guiding component is spaced apart from the side surface of the lower frame.

4. The illumination fan according to claim 1, wherein the outer sidewall of the lower frame comprises a first protrusion, the inner sidewall of the upper frame comprises a second protrusion, two recesses of the light guiding component are opposite to each other, the two recesses respectively correspond to the first protrusion and the second protrusion, and the first protrusion and the second protrusion respectively extend into the two recesses to jointly hold the light guiding component.

5. The illumination fan according to claim 1, wherein the housing comprises an annular opening connected to the accommodation space, and a part of the light guiding component protrudes from the annular opening.

6. The illumination fan according to claim 1, wherein a light receiving side of the light guiding component is close to the light source, a light emitting side of the light guiding component is away from the light source, and a horizontal width of the light receiving side is larger than a horizontal width of the light emitting side.

7. The illumination fan according to claim 4, wherein the first protrusion of the lower frame comprises a blocking surface, and a normal direction of the blocking surface is non-orthogonal to a normal direction of the side surface of the lower frame.

8. The illumination fan according to claim 4, wherein the second protrusion of the upper frame comprises an inclined surface and a vertical surface, the inclined surface is located between the side surface of the lower frame and the vertical surface, and the inclined surface extends from the vertical surface along a direction away from the outer sidewall of the lower frame.

9. The illumination fan according to claim 5, wherein a thickness of a part of the light guiding component in the accommodation space is smaller than half of a height of the accommodation space.

10. The illumination fan according to claim 5, wherein the part of the light guiding component protruding from the annular opening is in a shape of a cone.

11. An illumination fan, comprising:
    a housing defining a fan space and comprising an inner sidewall and an outer sidewall, the inner sidewall comprising a first protrusion, and the outer sidewall comprising a second protrusion;
    a fan blade disposed in the fan space;
    a light guiding component comprising two recesses opposite to each other, the two recesses respectively corresponding to the first protrusion and the second protrusion, and the first protrusion and the second protrusion respectively extending into the two recesses to jointly hold the light guiding component; and
    a light source disposed below the light guiding component, wherein the housing comprises an upper frame and a lower frame, the upper frame comprises the inner sidewall, and the lower frame comprises the outer sidewall.

12. The illumination fan according to claim 11, wherein the lower frame defines the fan space.

13. The illumination fan according to claim 11, wherein the lower frame further comprises a side surface, the inner sidewall of the upper frame, the outer sidewall and the side surface of the lower frame jointly define an accommodation space, and at least part of the light guiding component is disposed in the accommodation space.

14. The illumination fan according to claim 11, wherein a light receiving side of the light guiding component is close to the light source, a light emitting side of the light guiding component is away from the light source, and a horizontal width of the light receiving side is larger than a horizontal width of the light emitting side.

15. The illumination fan according to claim 13, wherein the light source comprises a circuit board and a light emitting unit, the light emitting unit is disposed on the circuit board, the circuit board is disposed in the accommodation space and is in an upright position, and a thickness direction of the circuit board is along a radial direction of the fan blade.

16. The illumination fan according to claim 13, wherein the light guiding component is spaced apart from the side surface of the lower frame.

17. The illumination fan according to claim 13, wherein the first protrusion of the lower frame comprises a blocking surface, and a normal direction of the blocking surface is non-orthogonal to a normal direction of the side surface of the lower frame.

18. The illumination fan according to claim 13, wherein the second protrusion of the upper frame comprises an inclined surface and a vertical surface, the inclined surface is located between the side surface of the lower frame and the vertical surface, and the inclined surface extends from the vertical surface along a direction away from the outer sidewall of the lower frame.

19. The illumination fan according to claim 13, wherein the housing comprises an annular opening connected to the accommodation space, and a part of the light guiding component protrudes from the annular opening.

20. The illumination fan according to claim 19, wherein a thickness of a part of the light guiding component in the accommodation space is smaller than half of a height of the accommodation space.

21. The illumination fan according to claim 19, wherein the part of the light guiding component protruding from the annular opening is in a shape of a cone.

\* \* \* \* \*